(12) United States Patent
Liu

(10) Patent No.: US 10,001,796 B2
(45) Date of Patent: Jun. 19, 2018

(54) LOW DROPOUT LINEAR VOLTAGE REGULATOR WITH COMPENSATION

(71) Applicant: EverDisplay Optronics (Shanghai) Limited, Shanghai (CN)

(72) Inventor: Che-Cheng Liu, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 0 days. days.

(21) Appl. No.: 15/360,433

(22) Filed: Nov. 23, 2016

(65) Prior Publication Data

US 2017/0371366 A1    Dec. 28, 2017

(30) Foreign Application Priority Data

Jun. 22, 2016    (CN) .......................... 2016 1 0455017

(51) Int. Cl.
*G05F 1/575* (2006.01)
*H03F 3/45* (2006.01)

(52) U.S. Cl.
CPC ......... *G05F 1/575* (2013.01); *H03F 3/45071* (2013.01); *H03F 2200/504* (2013.01); *H03F 2203/45674* (2013.01)

(58) Field of Classification Search
CPC ..... G05F 3/10; G05F 3/16; G05F 3/20; G05F 3/26; G05F 3/205; G05F 3/22; G05F 3/24; G05F 3/30
See application file for complete search history.

(56) References Cited

U.S. PATENT DOCUMENTS

| 7,218,087 B2* | 5/2007 | Lin ........................ G05F 1/575 323/280 |
| 2007/0241730 A1* | 10/2007 | Dow ...................... G05F 1/575 323/280 |
| 2014/0269092 A1* | 9/2014 | Rumberg ............... G11C 16/10 365/185.21 |
| 2016/0349776 A1* | 12/2016 | Conte ..................... G05F 1/575 |

* cited by examiner

*Primary Examiner* — Jue Zhang
*Assistant Examiner* — Lakaisha Jackson
(74) *Attorney, Agent, or Firm* — Yunling Ren

(57) ABSTRACT

The present disclosure provides a low dropout linear voltage regulator, including: an amplifier, configured to have a first input end receiving a reference voltage, a second input end configured to receive a feedback voltage, and an output end connected to a first node; an output transistor, having a control end connected to the first node, a first end connected to a first power source potential, and a second end connected to a second node and configured to provide an output voltage; a feedback circuit, connected to the second node and configured to provide the feedback voltage according to the output voltage; and a compensation circuit, comprising at least one of a first compensation amplifier, a second compensation amplifier and a first variable current source. The compensation circuit detects and suppresses a voltage transient generated when a load switching from light to heavy occurs at the second node.

12 Claims, 12 Drawing Sheets

Normal=1.802V  Min=1.077V                Max=1.9269V

Vout

IDC         10mA         10mA         10mA
      100uA       100uA       100uA       100uA

P4

( Before compensation )

Normal=1.803V   Min=1.5729V        Max=2.0030 V

Vout

IDC         10mA         10mA         10mA
      100uA       100uA       100uA       100uA

P4

(After compensation)

Fig.11B

LOW DROPOUT LINEAR VOLTAGE REGULATOR WITH COMPENSATION

CROSS-REFERENCE TO RELATED APPLICATIONS

This application is based upon and claims priority to Chinese Patent Application No. 201610455017.5, filed on Jun. 22, 2016, the entire contents thereof are incorporated herein by reference.

TECHNICAL FIELD

The present disclosure relates to the field of circuit technology, particularly to a low dropout linear voltage regulator.

BACKGROUND

With rapid development of mobile communication technology, various mobile terminals such as mobile phones, PDAs (Personal Digital Assistants), notebook computers, etc., have gradually gained popularity. With diversification of functionality, a variety of required power source levels also emerge at the right moment, and management of the power source has become especially important. For example, an excellent mobile terminal will not use a plurality of groups of power source to realize its powerful functionality. One solution is to generate various sub power sources corresponding to various functional applications within the mobile terminals by low dropout linear voltage regulators (referred to as LDOs for short). Therefore, low dropout linear voltage regulators are widely used in various mobile terminal products powered by batteries.

FIG. 1 is a schematic diagram of a low dropout linear voltage regulator in the related art. As shown is FIG. 1, the low dropout linear voltage regulator 100 includes an amplifier 102, a feedback circuit 104, an output transistor 106, and an external voltage-stabilizing capacitor 108. The feedback circuit 104 may include, for example, voltage-dividing resistors RD1 and RD2 connected in series. An output node of the low dropout linear voltage regulator 100 is coupled to a load 110. The output transistor 106 is coupled between an input node receiving an input voltage yin and an output node receiving an output voltage Vout. A gate electrode of the output transistor 106 is coupled to an output node of the amplifier 102. Input ends (including an in phase input terminal and a reversed phase input terminal) of the amplifier 102 are respectively coupled to a reference voltage Vref and a feedback voltage Vf of the feedback circuit.

In the voltage regulator as shown in FIG. 1, although the voltage-stabilizing capacitor 108 may stabilize the output voltage, it increases the volume of the system, and is difficult to achieve system integration and miniaturization/microminiaturization.

In another low dropout linear voltage regulator according to the related art, the external voltage-stabilizing capacitor 108 is omitted.

In system response, all linear voltage regulators will face mutual switching between light loads (low current supply states) and high loads (high current supply states). It is easy to generate a voltage transient in the switching process. If the voltage transient is too large, there will be possibility to cause the whole system to be unstable.

Therefore, it is desired to provide a method of effectively suppressing the voltage transient to reduce impact of the voltage transient and keep the system operating in a controllable condition.

The above information disclosed in this Background section is only for helping the understanding to the background of the present disclosure, therefore, it may include information that does not constitute prior art known by those skilled in the art.

SUMMARY

The present disclosure provides a low dropout linear voltage regulator, which may effectively suppress voltage transients.

According to a first aspect of the present disclosure, there is provided a low dropout linear voltage regulator, including:

an amplifier, having a first input end configured to receive a reference voltage, a second input end configured to receive a feedback voltage, and an output end connected to a first node;

an output transistor, having a control end connected to the first node, a first end connected to a first power source potential, and a second end connected to a second node and configured to provide an output voltage;

a feedback circuit, connected to the second node, and configured to provide the feedback voltage according to the output voltage; and a compensation circuit, comprising at least one of a first compensation amplifier, a second compensation amplifier and a first variable current source, wherein the first compensation amplifier has an input end connected to the second node, and an output end connected to the first node, and the first compensation amplifier configured to adjust a voltage of the first node according to the output voltage of the second node;

the second compensation amplifier has an input end connected to the first node, and an output end connected to the second node, and the second compensation amplifier is configured to adjust a supplemental current provided into the second node according to the voltage of the first node; and the first variable current source is connected between the first voltage source potential and the second node, and the first variable current source is configured to provide a current into the second node when the output voltage of the second node has a downward voltage transient.

According to some embodiments, the output transistor is a PMOS transistor.

According to some embodiments of the present disclosure, a compensation circuit including at least one of the first compensation amplifier, the second compensation amplifier and the first variable current source is adopted, to detect and suppress the voltage transient generated when a load switching from light to heavy occurs at the second node.

The other features and advantages of the present disclosure will become apparent from the following description, or may be partly learned by practising the present disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. Apparently, drawings in the following description are only some embodiments of the present disclosure. For those skilled in the art, other variants may also be obtained based on these drawings, without creative labor.

FIGS. 11A and 11B show performance comparison results.

DETAILED DESCRIPTION

Figure 1:
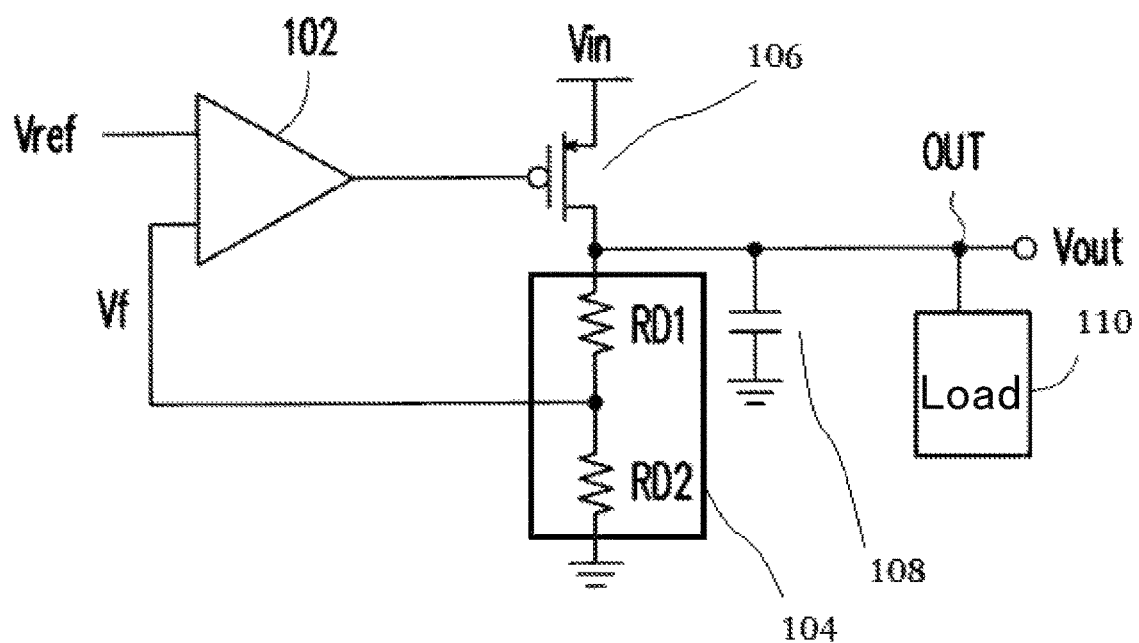
FIG. 1 shows a schematic diagram of a low dropout linear voltage regulator according to the related art.

The exemplary implementations of the present disclosure will now be described more fully by referring to the accompanying drawings. However, the exemplary implementations can be implemented in various forms and shall not be understood as being limited to the implementations set forth herein; instead, these implementations are provided so that this disclosure will be thorough and complete, and the conception of exemplary implementations will be fully conveyed to those skilled in the art. In the drawings, the same reference signs denote the same or similar structures, thus their detailed description will be omitted.

In addition, the described features, structures or characteristics may be combined in one or more embodiments in any suitable manner. In the following description, numerous specific details are provided so as to allow a full understanding to the embodiments of the present disclosure. However, those skilled in the art will recognize that the technical solutions of the present disclosure may be practiced without one or more of the specific details; or other components, steps and so on may be used. In other cases, well-known structures are not shown or described in detail so as to avoid obscuring various aspects of the present disclosure.

Figure 2:
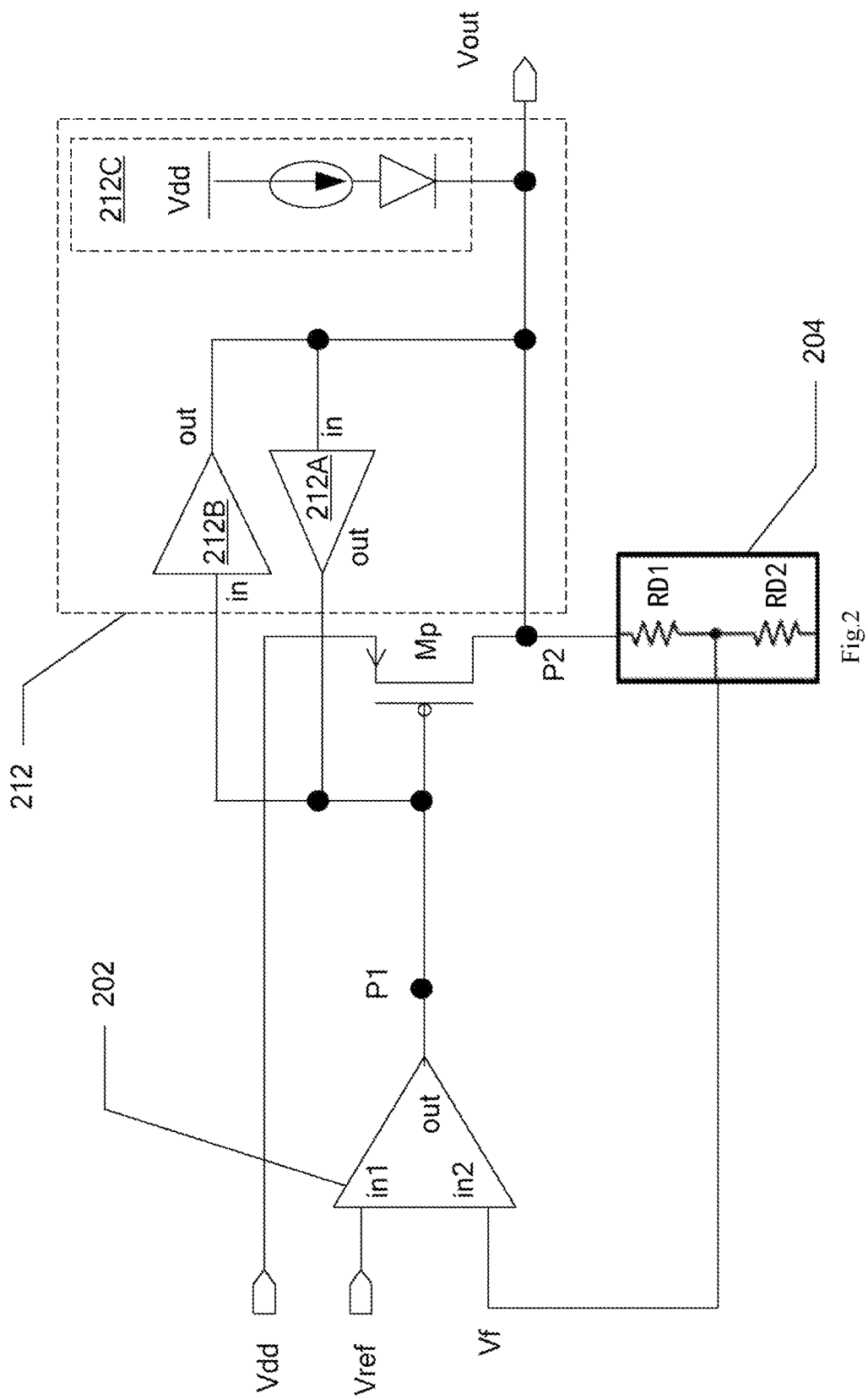
FIG. 2 shows a low dropout linear voltage regulator according to an embodiment of the present disclosure.

FIG. 2 shows a low dropout linear voltage regulator according to an embodiment of the present disclosure.

As shown in FIG. 2, the low dropout linear voltage regulator according to an embodiment of the present disclosure includes an amplifier 202, a feedback circuit 204, an output transistor Mp and a compensation circuit 212. Those skilled in the art can easily learn that, besides those as shown above, the low dropout linear voltage regulator circuit according to the present exemplary implementation may further include one or more among a driving power source circuit, a reference voltage generation circuit, a filtering circuit, a load short circuit protection circuit, an overvoltage turn-off circuit, an overheating turn-off circuit, a reverse connection protection circuit and so on, which will not be repeated herein since they are only well-known auxiliary circuit.

The amplifier 202 may have a first input end in1, a second input end in2 and an output end "out". The first input end in1 is configured to receive a reference voltage Vref, the second input end in2 is configured to receive a feedback voltage Vf, and the output end is connected to a first node P1. The amplifier 202 outputs a driving voltage to the first node P1 according to a difference value between the reference voltage Vref and the feedback voltage Vf.

The output transistor Mp may have a control end, a first end and a second end. The control end of the output transistor Mp is connected to the first node P1, the first end of the output transistor Mp is connected to a first power source potential Vdd, the second end of the output transistor Mp is connected to a second node P2 and provides an output voltage Vout. According to an embodiment, the output transistor Mp may be a PMOS (P-channel Metal Oxide Semiconductor) transistor.

The feedback circuit 204 may be connected to the second node P2, and provide the feedback voltage Vf to the second input end in2 of the amplifier 202 according to the output voltage Vout. The feedback circuit 204 may include, for example, voltage-dividing resistors RD1 and RD2 connected in series.

The compensation circuit 212 may include at least one of a first compensation amplifier 212A, a second compensation amplifier 212B and a first variable current source 212C. That is, the compensation circuit 212 may include any one of the first compensation amplifier 212A, the second compensation amplifier 212B and the first variable current source 212C, or it may include a combination of any two of the three, or it may include all of the three.

The first compensation amplifier 212A has an input end "in" and an output end "out". The input end "in" is connected to the second node P2 and the output end "out" is connected to the first node P1. The first compensation amplifier 212A adjusts a voltage of the first node P1 according to the output voltage Vout of the second node P2.

The second compensation amplifier 212B has an input end "in" and an output end "out". The input end "in" of the second compensation amplifier 212B is connected to the first node P1 and the output end "out" of the second compensation amplifier 212B is connected to the second node P2. The second compensation amplifier 212B adjusts a supplemental current injected into the second node P2 according to the voltage of the first node P1.

The first variable current source 212C is connected between the first voltage source potential Vdd and the second node P2, and the first variable current source 212C injects current into the second node P2 when the output voltage Vout of the second node P2 has a downward voltage transient.

According to embodiments of the present disclosure, a compensation circuit 212 including at least one of the first compensation amplifier 212A, the second compensation amplifier 212B and the first variable current source 212C is adopted, to detect and suppress the voltage transient generated when a load switching from light to heavy occurs at the second node P2.

For example, when the load switching occurs, the output voltage Vout changes. The second compensation amplifier 212B and the first variable current source 212C detect that the output voltage is changing, then provide the supplemental currents to satisfy current requirement of the load. The first compensation amplifier 212A assists the voltage of the first node P1 (i.e. the voltage of the gate electrode of the output transistor) to change swiftly, so that the output transistor Mp can outputs a target current quickly. Thus, the voltage transient caused by the load switching may be suppressed swiftly and effectively. When the voltage regulator accomplishes the switch of the load from light to heavy, the first compensation amplifier 212A, the second compensation amplifier 212B and the first variable current source 212C may close automatically.

In addition, the voltage regulator according to embodiments of the present disclosure does not need to be provided with an external capacitor. On one hand, the cost and the design complexity of the system may be reduced, and on the other hand, the overall space occupancy of the low dropout linear voltage regulator circuit may be reduced, which is convenient for miniaturization of products.

Figure 3:
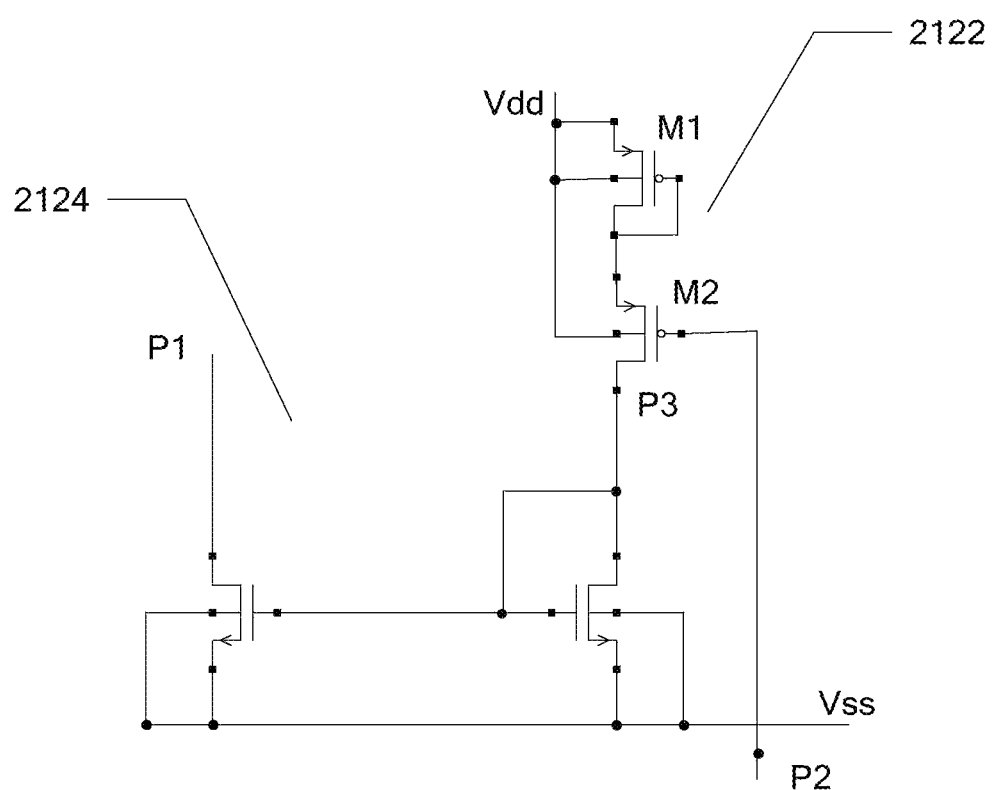
FIG. 3 shows a first compensation amplifier according to an embodiment of the present disclosure.

FIG. 3 shows a first compensation amplifier 212A according to an embodiment of the present disclosure.

As shown in FIG. 3, the first compensation amplifier 212A may include a second variable current source 2122 and a first current mirror 2124. The second variable current source 2122 is connected to a third node P3. The first current mirror 2124 has an input end connected to the third node P3 and an output end connected to the first node P1.

According to an embodiment, the second variable current source 2122 may include a first transistor M1 and a second transistor M2. A first end of the first transistor M1 is connected to the first power source potential Vdd, and a second end and a control end of the first transistor M1 are connected to a first end of the second transistor M2. A control end of the second transistor M2 is connected to the second node P2, and a second end of the second transistor M2 is connected to the third node P3.

The structure, constitution and usage of first current mirror 2124 are well-known to those skilled in the art, which is not described in details herein.

Figure 4:
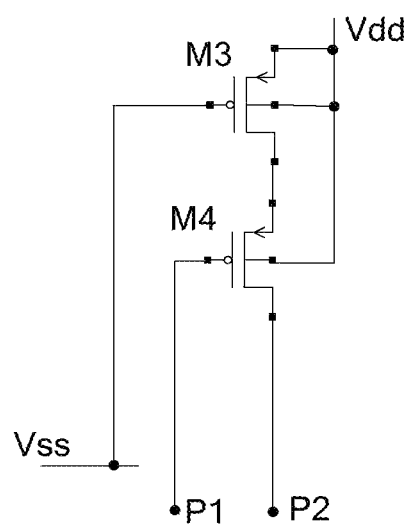
FIG. 4 shows a second compensation amplifier according to an embodiment of the present disclosure.

FIG. 4 shows a second compensation amplifier 212B according to an embodiment of the present disclosure.

As shown in FIG. 4, the second compensation amplifier 212B may include a third transistor M3 and a fourth transistor M4. A first end of the third transistor M3 is connected to the first power source potential Vdd, a second end of the third transistor M3 is connected to a first end of the fourth transistor M4, and a control end of the third transistor M3 is connected to a second power source potential Vss. The second power source potential Vss may be for example a ground potential. A second end of the fourth transistor is connected to the second node P2, and a control end of the fourth transistor is connected to the first node P1.

Figure 5:
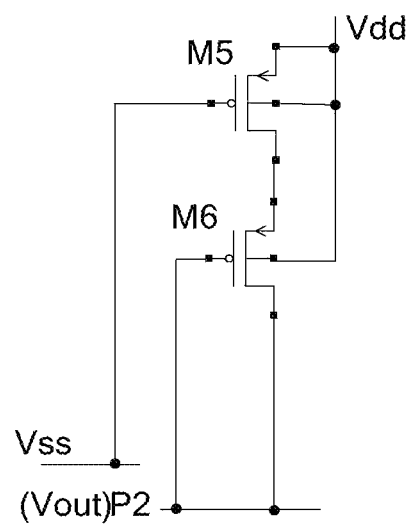
FIG. 5 shows a first variable current source according to an embodiment of the present disclosure.

FIG. 5 shows a first variable current source 212C according to an embodiment of the present disclosure.

As shown in FIG. 5, the first variable current source 212C may include a fifth transistor M5 and a sixth transistor M6. A first end of the fifth transistor M5 is connected to the first power source potential Vdd, a second end of the fifth transistor M5 is connected to a first end of the sixth transistor M6, and a control end of the fifth transistor M5 is connected to the second power source potential Vss. A control end and a second end of the sixth transistor are connected to the second node P2.

Referring to FIGS. 3-5, when the voltage regulator provides a stable current, the output voltage of the second node P2 may present a constant value. When the voltage regulator needs to switch from a light load to a high load and then the current needs to increase greatly, since the output transistor Nip responds slowly, i.e., the there is a delay time in responding, the output voltage Vout will drop down from an ideal value, thereby forming a negative voltage transient. At this time, the first variable current source 212C may detect that the output voltage Vout begins to drop down, it will firstly respond to assist in providing the current required by respective sub-modules or the load on the stage subsequent to the output voltage Vout. The voltage of the first node P1 will also begin to drop down, which will drive the output transistor Mp gradually increase the output current to a desired value. After the second compensation amplifier 212B detects that the voltage of the first node P1 drops down, it begins to provide supplemental current to assist in providing the current required by respective sub-modules or the load on the stage subsequent to the output voltage Vout. The first compensation amplifier 212A assists the voltage of the first node P1 to change swiftly, so that the output transistor Mp can outputs a target current more quickly. When the voltage regulator accomplishes the switch from the light load to a heavy load, the output voltage Vout will return to a theoretical voltage value, and the compensation circuit will close automatically.

Figure 6:
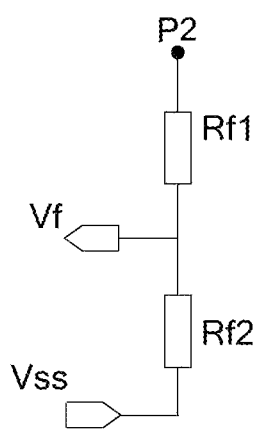
FIG. 6 shows a feedback circuit according to an embodiment of the present disclosure.

FIG. 6 shows a feedback circuit according to an embodiment of the present disclosure.

As shown in FIG. 6, the feedback circuit may include a first voltage-dividing resistor Rf1 and a second voltage-dividing resistor Rf2. In the embodiment, the first voltage-dividing resistor Rf1 has a first end connected to the second node P2 and a second end connected to the second input end in2 of the amplifier 202. The second voltage-dividing resistor Rf2 has a first end connected to the second end of the first voltage-dividing resistor Rf1 and a second end connected to the second power source potential Vss.

Figure 7:
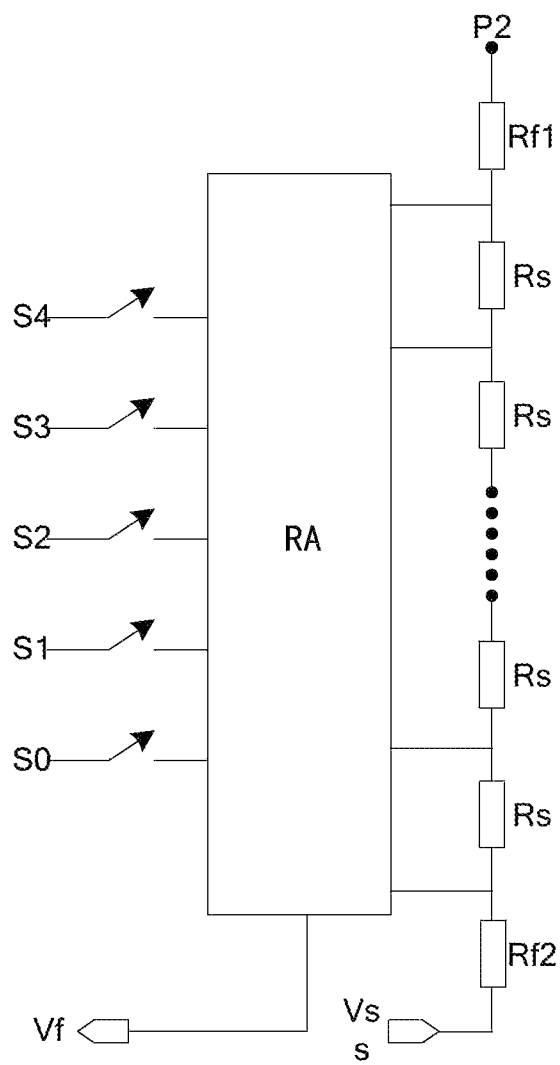
FIG. 7 shows a feedback circuit according to another embodiment of the present disclosure.

FIG. 7 shows a feedback circuit according to another embodiment of the present disclosure.

As shown in FIG. 7, the feedback circuit may include a first voltage-dividing resistor Rf1, a second voltage-dividing resistor Rf2, a switching circuit. RA and at least one adjusting resistor Rs. In the embodiment, the first voltage-dividing resistor Rf1 has a first end connected to the second node P2 and a second end. The second voltage-dividing resistor Rf2 has a first end and a second end, and the second end is connected to the second power source potential Vss. The at least one adjusting resistor Rs is connected between the second end of the first voltage-dividing resistor Rf1 and the first end of the second voltage-dividing resistor Rf2 in series. The present exemplary implementation takes 31 adjusting resistors Rs as an example.

S4, S3, S2, S1 and S0 are state selection control switches, and correspond to totally 5 control signals, therefore, they may generate 32, i.e., $2^5$ binary codes. Since there are 31 identical resistors between Rf1 and Rf2, 32 voltages of nodes are generated, such that the output voltage potential of the second node P2 is adjusted through the feedback voltage Vf.

The switching circuit RA selects whether to short-circuit respective adjusting resistors Rs or not according to switch signals, and provides a voltage-dividing sampling signal of the feedback circuit to the second input end of the amplifier. Therefore, 32 different voltage-dividing sampling ratios of the output voltage Vout may be obtained, thus 32 different output voltages may be obtained. For example, the circumstance that all the 31 adjusting resistors are short-circuited corresponds to the feedback circuit in FIG. 6. As another example, if 30 adjusting resistors are short-circuited, an output voltage Vout-ΔV or Vout+ΔV may be obtained, wherein ΔV is a minimum adjustment value of the output voltage. The size of ΔV is determined by the resistance value used by Rs.

The above switching signals may be generated by switching on-off combinations of switches. In the present exemplary implementation, if the number of the adjusting resistors Rs is n, the following formula (1) shall be satisfied:

$$2^{m-1} \leqslant n < 2^m \qquad (1)$$

wherein the switching signals are generated by on-off combinations of m switches, and wherein n>0, and m>0.

Those skilled in the art will readily understand that, in other exemplary embodiments of the present disclosure, the feedback circuit 204 may adopt other manners to adjust the voltage-dividing sampling ratios of the output voltage Vout, which is not limited to the manner exemplified in the present exemplary implementation.

Figure 8:
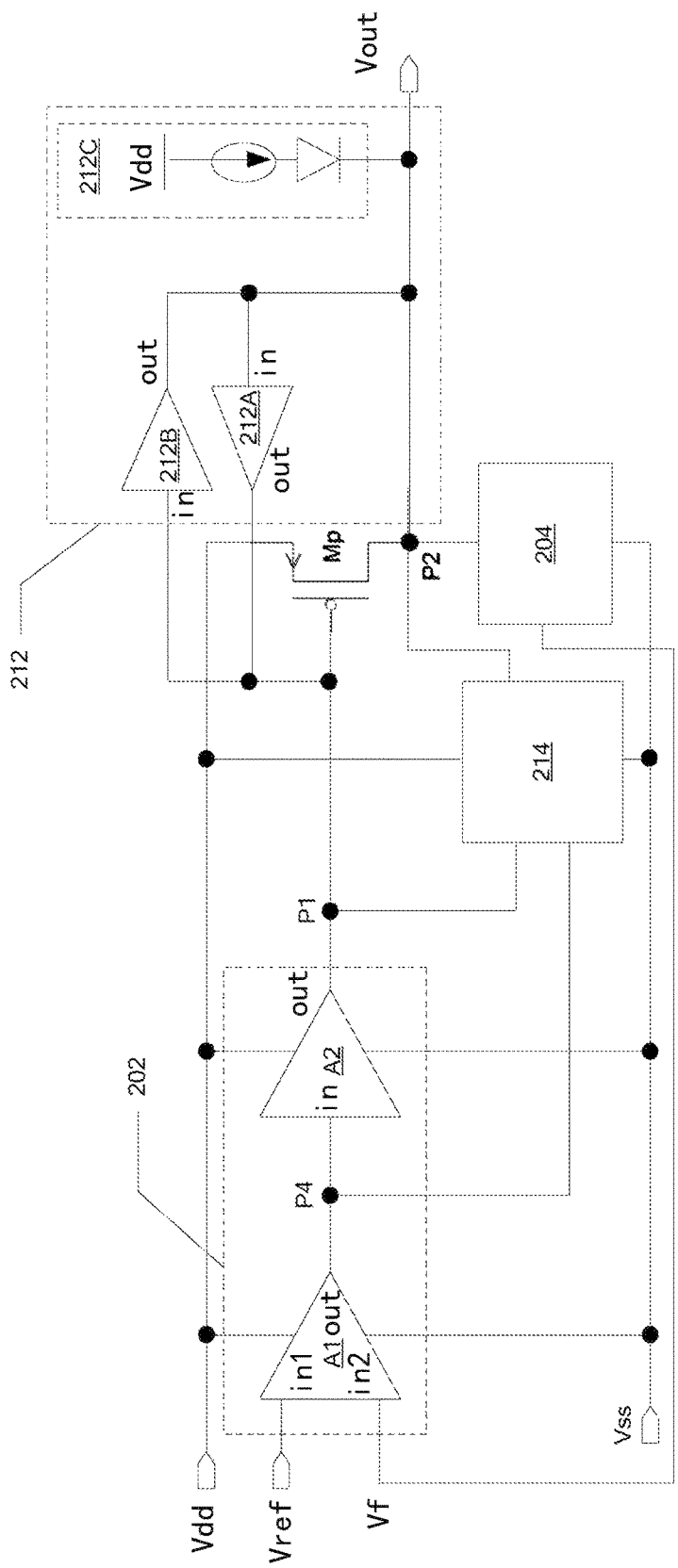
FIG. 8 shows a voltage regulator according to another embodiment of the present disclosure.

FIG. 8 shows a voltage regulator according to another embodiment of the present disclosure, wherein the same item numbers as that in FIG. 2 refer to the same circuits as that in FIG. 2.

As shown in FIG. 8, in the voltage regulator according to the present embodiment, the amplifier 202 includes a first stage amplifier A1 and a second stage amplifier A2. In addition, the voltage regulator further may further include a Miller capacitance compensation circuit 214.

Referring to FIG. 8, the first stage amplifier A1 has a first input end in1 receiving the reference voltage Vref, a second input end in2 receiving the feedback voltage Vf, and an output end "out" connected to a fourth node P4. The first stage amplifier A1 may include for example an operational transconductance amplifier, so as to amplify a difference value between the feedback voltage Vf and the reference voltage Vref, and output the amplified difference value.

The second stage amplifier A2 has an input end "in" connected to the fourth node P4, and an output end "out" connected to the first node P1. The second stage amplifier A2 may include for example a voltage amplifier with a negative gain, so as to amplify the input voltage, and output the amplified input voltage to the first node P1.

The Miller capacitance compensation circuit 214 is connected to the first node P1, the second node P2 and the fourth node P4, as shown in FIG. 8.

Figure 9:
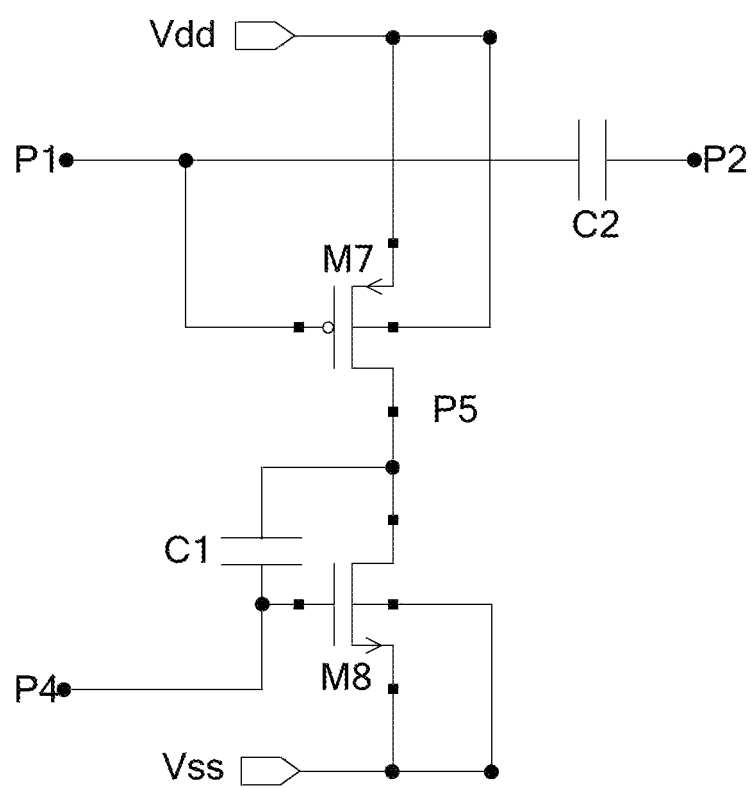
FIG. 9 shows a Miller capacitance compensation circuit according to an embodiment of the present disclosure.

FIG. 9 shows a Miller capacitance compensation circuit according to an embodiment of the present disclosure.

As shown in FIG. 9, the Miller capacitance compensation circuit includes a seventh transistor M7, an eighth transistor M8, a first capacitor C1 and a second capacitor C2.

Referring to FIG. 9, the seventh transistor M7 has a control end connected to the first node P1, a first end connected to the first power source potential Vdd, and a second end connected to a fifth node P5.

The eighth transistor M8 has a control end connected to the fourth node P4, a first end connected to the second power source potential Vss, and a second node connected to the fifth node P5.

The first capacitor C1 has one end connected to the fourth node P4, and the other end connected to the fifth node P5.

The second capacitor C2 has one end connected to the first node P1, and the other end connected to the second node P2.

According to the present embodiment, through a MIM (metal-insulator-metal) capacitor, a Miller equivalent capacitor, which is enough to replace an external capacitor, may be generated by using the Miller principle.

It is easy to understand that, in other exemplary embodiments of the present disclosure, the seventh transistor M7 may be a N-channel transistor, the eighth transistor M8 may be a P-channel transistor, the first power source potential may be a low level, and the second power source potential may provide a high level. Further, in the present exemplary implementation, in order to facilitate controlling and simplify the circuit, the seventh transistor M7 and the eighth transistor M8 have opposite channel types, but it is not limited thereto.

In the low dropout linear voltage regulator circuit according to the present exemplary implementation, the dominant pole of the transfer function of the low dropout linear voltage regulator circuit is generated by the output of the first stage amplifier A1 together with the Miller capacitance compensation circuit, shown as the following formula (2) specifically:

$$p_1 = \frac{1}{RC} = \frac{1}{C_1(gm_8 ro_8 + 1)Rout_{A1}} \quad (2)$$

wherein $(gm_8 ro_8+1)$ is a generated Miller coefficient, and the first capacitor C1 may be amplified, such that the equivalent amplified capacitance value of the first capacitor C1 is enough to replace an external capacitor; and $Rout_{A1}$ is an equivalent output impedance of an output signal of the first stage amplifier A1.

In addition, a new zero Z1 is generated by the second capacitor C2, as the following formula (3):

$$Z_1 = \frac{1}{RC} = \frac{gm_p}{C_2} \quad (3)$$

wherein $gm_p$ is a transmission transconductance of the output end of the Miller capacitance compensation circuit. When the load is pulling the voltage and current down, the Miller capacitance compensation circuit may provide a sufficiently-fast response speed, such that the output voltage Vout may quickly return to a stable state, that is, it may ensure transient response performance of the low dropout linear voltage regulator circuit with respect to the load.

Figure 10:
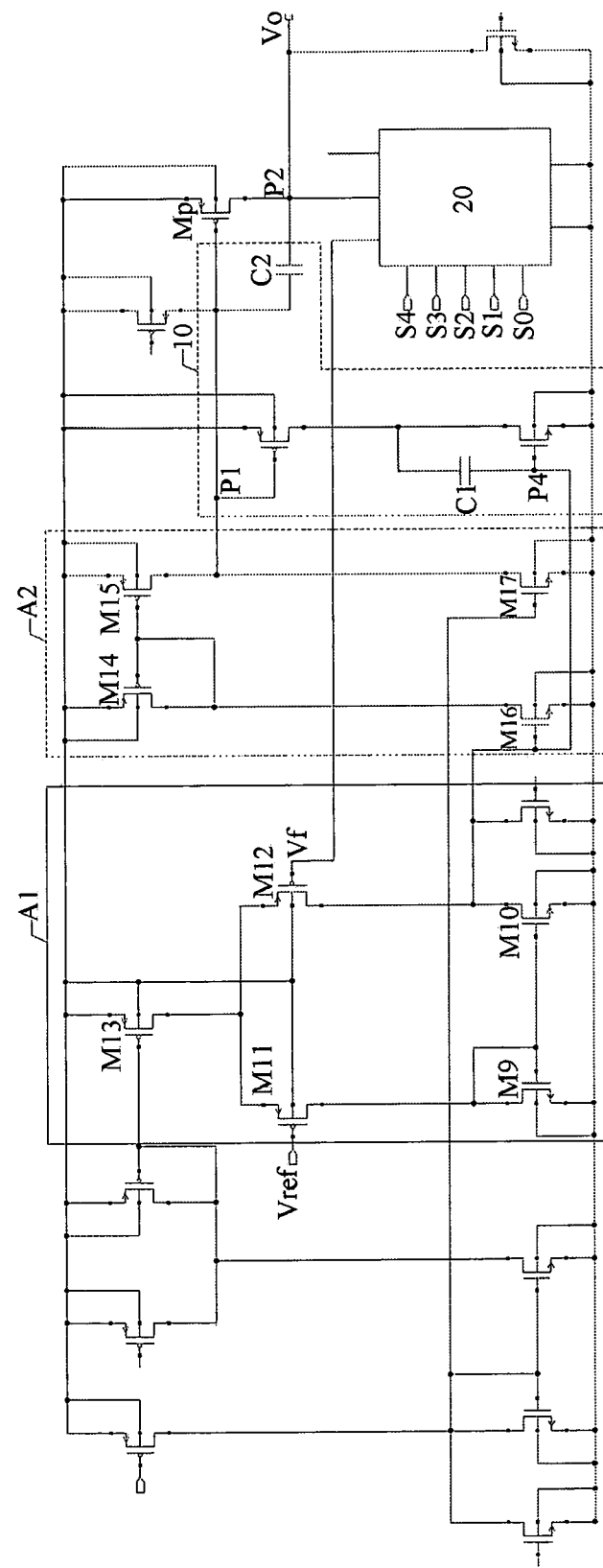
FIG. 10 shows an amplifier according to an embodiment of the present disclosure.

FIG. 10 shows an amplifier according to an embodiment of the present disclosure.

As shown in FIG. 10, the first stage amplifier A1 includes a second current mirror and a differential pair circuit. The second current mirror is composed of a ninth transistor M9 and a tenth transistor M10. In the present exemplary implementation, the ninth transistor M9 and the tenth transistor M10 may be N-channel transistors, together constituting a common-source-and-common-gate type current mirror. The differential pair circuit is composed of an eleventh transistor M11 and a twelfth transistor M12. In the present exemplary implementation, the eleventh transistor M11 and the twelfth transistor M12 may be P-channel transistors. The differential pair circuit amplifies a difference value between the reference voltage Vref and the feedback voltage Vf, and outputs the amplified difference value through the second current mirror. In addition, the first stage amplifier A1 may further include other devices such as a thirteenth transistor M13, etc., as shown in FIG. 10.

The second stage amplifier A2 includes a third current mirror and a transistor pair. The third current mirror is composed of a fourteenth transistor M14 and a fifteenth transistor M15. In the present exemplary implementation, the fourteenth transistor M14 and the fifteenth transistor M15 may be P-channel transistors, together constituting a common-source-and-common-gate type current mirror. The transistor pair is composed of a sixteenth transistor M16 and a seventeenth transistor M17. In the present exemplary implementation, the sixteenth transistor M16 and the seventeenth transistor M17 may be N-channel transistors. The transistor pair amplifies the voltage of the fourth node P4, and outputs the amplified voltage through the third current mirror. Those skilled in the art may also alter components of the first stage amplifier A1 and the second stage amplifier A2 as needed.

Figure 11A:
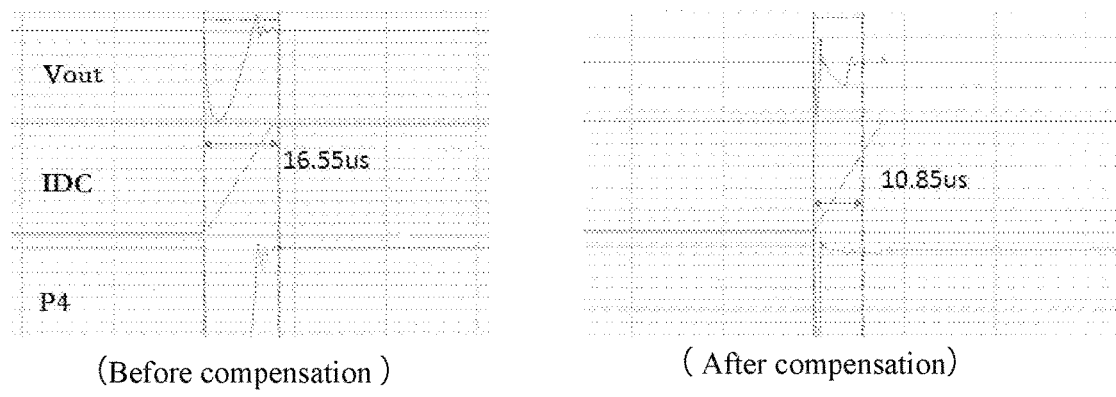

FIGS. 11A and 11B show simulation performance comparison between a result obtained by the voltage regulator according to an embodiment of the present disclosure and a result obtained by a voltage regulator without adopting the technical solution of the present disclosure.

FIG. 11A shows a stabilization time comparison before and after compensation. It can be seen from FIG. 11A that, in a case where the compensation circuit according to an embodiment of the present disclosure is adopted, the stabilization time is effectively improved at both the second node P2 and the fourth node P4. The reference sign IDC in FIG. 11A represents a load current.

FIG. 11B shows a voltage transient comparison before and after compensation. It can be seen from FIG. 11B that, in a case where no compensation circuit according to an embodiment of the present disclosure is adopted, a positive voltage transient is 124.9 mV (i.e., 1.9269 mV minus 1.802 mV), and a negative voltage transient is 725 mV (i.e., 1.802 mV minus 1.077 mV). In a case where the compensation circuit according to an embodiment of the present disclosure is adopted, a positive voltage transient is 200 mV (i.e., 2.003 mV minus 1.803 mV), and a negative voltage transient is 230.1 mV (i.e., 1.803 mV minus 1.5729 mV). It can be seen that, by adopting the compensation circuit according to an embodiment of the present disclosure, the positive voltage transient increases just little (about several decades mV), but the negative voltage transient is improved greatly. Although the simulation is performed with respect to a circuit of an embodiment of the present disclosure for negative voltage transients, however, it is easy to understand that the technical solution of the present disclosure is also applicable for positive voltage transients, which may be directly achieved by recombining the compensation circuits of the shown embodiments by using a complementarily-controlled circuit architecture. Since influence of positive voltage transients is not large, compared with negative voltage transients, the compensation circuit for positive voltage transients is not illustrated in detail herein.

Through the above detailed description, those skilled in the art may readily appreciate that systems and methods according to embodiments of the present disclosure have one or more of the following advantages.

According to some embodiments of the present disclosure, a compensation circuit including at least one of the first compensation amplifier, the second compensation amplifier and the first variable current source is adopted, to detect and suppress the voltage transient generated when a load switching from light to heavy occurs at the second node.

According to some embodiments of the present disclosure, the voltage transient caused by the load switching may be suppressed swiftly and effectively.

According to some embodiments of the present disclosure, the voltage regulator may be provided without an external capacitor. On one hand, the cost and the design complexity of the system may be reduced, and on the other hand, the overall space occupancy of the low dropout linear voltage regulator circuit may be reduced, which is convenient for miniaturization of products.

According to some embodiments of the present disclosure, through the Miller capacitance compensation circuit, when the load is pulling the voltage and current down, the Miller capacitance compensation circuit may provide a sufficiently-fast response speed, such that the output voltage may quickly return to a stable state.

Those skilled in the art may appreciate that the drawings are only schematic diagrams of exemplary embodiments. The specific modules shown in the drawings may not be necessarily-essential for implementing the present disclosure, which cannot be used to limit the protection scope of the present disclosure.

Those skilled in the art may understand that the above respective modules may be distributed in a device according to the description of the embodiments, or they may also be changed correspondingly and located in one or more devices different from the present embodiments. Modules in the embodiments may be combined into one module, or may also be further split into more sub-modules.

Hereinabove, exemplary embodiments of the present disclosure have been illustrated and described in detail. It should be appreciated that the present disclosure is not limited to the embodiments disclosed herein. Rather, the present disclosure intends to cover various modifications and equivalent arrangements included in the spirit and scope of the claims.

What is claimed is:

1. A low dropout linear voltage regulator with compensation, comprising:
    an amplifier, having a first input end configured to receive a reference voltage, a second input end configured to receive a feedback voltage, and an output end connected to a first node;
    an output transistor, having a control end connected to the first node, a first end connected to a first power source potential, and a second end connected to a second node and configured to provide an output voltage;
    a feedback circuit, connected to the second node, and configured to provide the feedback voltage according to the output voltage; and
    a compensation circuit, comprising a first compensation amplifier and at least one of a second compensation amplifier and a first variable current source,
    wherein the first compensation amplifier has an input end connected to the second node, and an output end connected to the first node, and the first compensation amplifier is configured to adjust a voltage of the first node according to the output voltage of the second node;
    the second compensation amplifier has an input end connected to the first node, and an output end connected to the second node, and the second compensation amplifier is configured to adjust a supplemental current provided into the second node according to the voltage of the first node; and
    the first variable current source is connected between the first voltage source potential and the second node, and the first variable current source is configured to provide a current into the second node when the output voltage of the second node has a downward voltage transient.

2. The low dropout linear voltage regulator with compensation according to claim 1, wherein the first compensation amplifier comprises:
    a second variable current source, connected to a third node; and
    a first current mirror, having an input end connected to the third node, and an output end connected to the first node.

3. The low dropout linear voltage regulator with compensation according to claim 2, wherein the second variable current source comprises a first transistor and a second transistor, each of the first transistor and the second transistor has a first end, a second end and a control end, wherein the first end of the first transistor is connected to the first power source potential, and the second end of the first transistor and the control end of the first transistor are connected to the first end of the second transistor; and the control end of the second transistor is connected to the second node, and the second end of the second transistor is connected to the third node.

4. The low dropout linear voltage regulator with compensation according to claim 1, wherein the second compensation amplifier comprises a third transistor and a fourth transistor, each of the third transistor and the fourth transistor has a first end, a second end and a control end, wherein the first end of the third transistor is connected to the first power source potential, the second end of the third transistor is connected to the first end of the fourth transistor, and the control end of the third transistor is connected to the second power source potential; and the second end of the fourth transistor is connected to the second node, and the control end of the fourth transistor is connected to the first node.

5. The low dropout linear voltage regulator with compensation according to claim 1, wherein the first variable current source comprises a fifth transistor and a sixth transistor, each of the fifth transistor and the sixth transistor has a first end, a second end and a control end, wherein the first end of the fifth transistor is connected to the first power source potential, the second end of the fifth transistor is connected to the first end of the sixth transistor, and the control end of the fifth transistor is connected to the second power source potential; and the control end and the second end of the sixth transistor are connected to the second node.

6. The low dropout linear voltage regulator with compensation according to claim 1, wherein the feedback circuit comprises:

a first voltage-dividing resistor, having a first end connected to the second node, and a second end connected to the second input end of the amplifier; and a second voltage-dividing resistor, having a first end connected to the second end of the first voltage-dividing resistor, and a second end connected to the second power source potential.

7. The low dropout linear voltage regulator with compensation according to claim 1, wherein the amplifier comprises:

a first stage amplifier, having a first input end configured to receive the reference voltage, a second input end configured to receive the feedback voltage, and an output end connected to the fourth node; and a second stage amplifier, having an input end connected to the fourth node, and an output end connected to the first node, wherein the low dropout linear voltage regulator with compensation further comprises:

a Miller capacitance compensation circuit, connected to the first node, the second node and the fourth node.

8. The low dropout linear voltage regulator with compensation according to claim 7, wherein the Miller capacitance compensation circuit comprises:

a seventh transistor, having a control end connected to the first node, a first end connected to the first power source potential, and a second end connected to a fifth node;

an eighth transistor, with a channel type opposite to that of the seventh transistor, having a control end connected to the fourth node, a first end connected to the second power source potential, and a second node connected to the fifth node;

a first capacitor, having one end connected to the fourth node, and the other end connected to the fifth node; and a second capacitor, having one end connected to the first node, and the other end connected to the second node.

9. The low dropout linear voltage regulator with compensation according to claim 7, wherein the first stage amplifier comprises an operational transconductance amplifier.

10. The low dropout linear voltage regulator with compensation according to claim 9, wherein the first stage amplifier comprises:

a second current mirror, and a differential pair, configured to amplify a difference value between the reference voltage and the feedback voltage, and to output the amplified difference value through the second current mirror.

11. The low dropout linear voltage regulator with compensation according to claim 7, wherein the second stage amplifier comprises:

a third current mirror; and a transistor pair, configured to amplify a voltage of the fourth node, and to output the amplified voltage through the third current mirror.

12. The low dropout linear voltage regulator with compensation according to claim 1, wherein the output transistor is a PMOS transistor.

* * * * *